(12) United States Patent
Hedges et al.

(10) Patent No.: US 7,300,526 B2
(45) Date of Patent: **\*Nov. 27, 2007**

(54) METHOD AND SYSTEM FOR REMOVAL OF CONTAMINATES FROM PHASESHIFT PHOTOMASKS

(75) Inventors: Shad Hedges, Meridian, ID (US); James Baugh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/368,895

(22) Filed: Mar. 6, 2006

(65) Prior Publication Data
US 2006/0144425 A1    Jul. 6, 2006

Related U.S. Application Data

(62) Division of application No. 10/090,986, filed on Mar. 4, 2002, now Pat. No. 7,008,487.

(51) Int. Cl.
*B08B 3/02* (2006.01)

(52) U.S. Cl. .................. 134/33; 134/182; 134/183

(58) Field of Classification Search .............. 134/902, 134/32, 33, 42, 2, 1.3
See application file for complete search history.

(56) References Cited

U.S. PATENT DOCUMENTS

| | | | |
|---|---|---|---|
| 2,600,580 A | 6/1952 | Sabel et al. | |
| 4,611,967 A | 9/1986 | Tsutsui | |
| 4,833,051 A | 5/1989 | Imamura | |
| 5,306,376 A | 4/1994 | James | |
| 5,492,587 A | 2/1996 | Hong | |
| 5,634,230 A | 6/1997 | Maurer | |
| 5,723,860 A | 3/1998 | Hamada et al. | |
| 5,769,984 A | 6/1998 | Yen et al. | |
| 5,938,860 A | 8/1999 | Williams | |
| 6,083,577 A | 7/2000 | Nakagawa et al. | |
| 6,190,743 B1 | 2/2001 | Wang | |
| 6,234,080 B1 | 5/2001 | Tani | |
| 6,374,736 B1 | 4/2002 | Cresgy et al. | |
| 6,594,847 B1 | 7/2003 | Krusell et al. | |

FOREIGN PATENT DOCUMENTS

EP    0454169 A2    10/1991

(Continued)

OTHER PUBLICATIONS

U.S. Appl. No. 10/090,986, filed Mar. 4, 2002, Hedges et al.

*Primary Examiner*—Frankie L. Stinson
(74) *Attorney, Agent, or Firm*—Perkins Coie LLP (57) ABSTRACT

A system and method to clean the pellicle frame and adhesive ring of a photomask reticle are described. One embodiment includes a cover that isolates the photomasks from the pellicle frame. The reticle is secured between a spin chuck and the cover so that the photomasks are isolated and protected from solvents used in a cleaning process. With the reticle secured to the spin chuck, the spin chuck is rotated under a pressurized spray of solvent. The solvent, which is caustic to the photomasks, removes the contaminants from the adhesive ring. After the exposed areas are cleaned, the cover is removed and foreign material from photomasks are removed using less invasive solvents and methods.

14 Claims, 6 Drawing Sheets

FOREIGN PATENT DOCUMENTS

| | | |
|---|---|---|
| JP | 61-188934 A | 8/1986 |
| JP | 1-178449 A | 7/1989 |
| JP | 5-228450 A | 9/1993 |
| JP | 9-146261 A | 6/1997 |
| JP | 10-114388 A | 5/1998 |
| JP | 10-189421 A | 7/1998 |
| JP | 10-308337 A | 11/1998 |
| JP | 11-235811 A | 8/1999 |
| JP | 2000-194121 | 7/2000 |

METHOD AND SYSTEM FOR REMOVAL OF CONTAMINATES FROM PHASESHIFT PHOTOMASKS

CROSS-REFERENCE TO RELATED APPLICATION

This application is a divisional of U.S. patent application Ser. No. 10/090,986, filed Mar. 4, 2002, now U.S. Pat. No. 7,008,487 which is incorporated herein by reference in its entirety.

TECHNICAL FIELD

The following disclosure relates generally to tools and processes for fabricating microelectronic devices and micromechanical devices; more particularly, the following disclosure describes methods and apparatus for cleaning a reticle.

BACKGROUND

Microelectronic and micromechanical devices are generally formed on a semiconductor wafer, a glass substrate or another type of workpiece using several repetitions of doping, deposition, etching, planarizing and/or lithographic processes. A plurality of individual devices are fabricated on a single workpiece and then the workpiece is cut to form multiple individual dies, such as semiconductor integrated circuit ("IC") chips, field emission displays and other devices. Each chip includes many semiconductor components, conductive lines, etc. The devices accordingly include various materials, including electrical conductors (e.g., aluminum, tungsten, copper), electrical semiconductors (e.g., silicon) and electrical non-conductors (e.g., silicon dioxide).

Lithographic processes delineate a pattern in a layer of material (e.g., photoresist) sensitive to photons, electrons, or ions. The principle is similar to that of a photocamera in which an object is imaged on a photo-sensitive emulsion film. Unlike a photo-camera where the "final product" is the printed image, the image in the semiconductor process context typically is an intermediate pattern that defines regions where material is deposited on or removed from the wafer. Lithographic processes typically involve multiple exposing and developing steps. An exposing step typically involves directing a patterned beam of photons. electrons, or ions against the layer of resist. After an exposing step, a developing step involves removing one of either the exposed or unexposed portions of photoresist. Complex patterns typically require multiple exposure and development steps.

Figure 1:
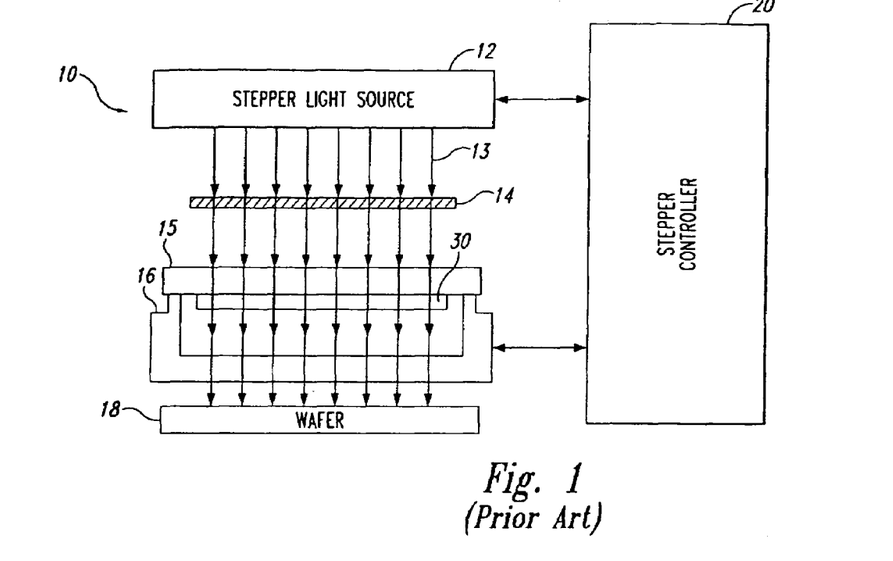
FIG. 1 is a schematic diagram of a conventional lithographic system with a photomask and wafer.

A typical lithographic system, shown in FIG. 1, includes a light source 12, an optical system 14, and a transparent photomask 15. During a lithographic process, light 13 from the light source 12 passes through the optical system 14 and the photomask 15 onto a photoresist layer 18. The photomask 15 is held in place by the reticle table 16. The controller 20, also known as the aligner, controls the relative position of the light source 12 and reticle table 16. The photomask 15 defines the "intermediate pattern" used for determining where photoresist is to be removed or left in place. Conventional photomasks generally have a transparent glass blank and a thin opaque film on the blank. The blank and the film together define a reticle. Conventional materials for the blank include soda lime, borosilicate glass, or fused silica. The opaque film can be a patterned layer of chrome less than 100 microns thick and an anti-reflective coating, such as chrome oxide, on the chrome. The purpose of the anti-reflective coating is to suppress ghost images from the light reflected by the opaque material.

Figure 2:
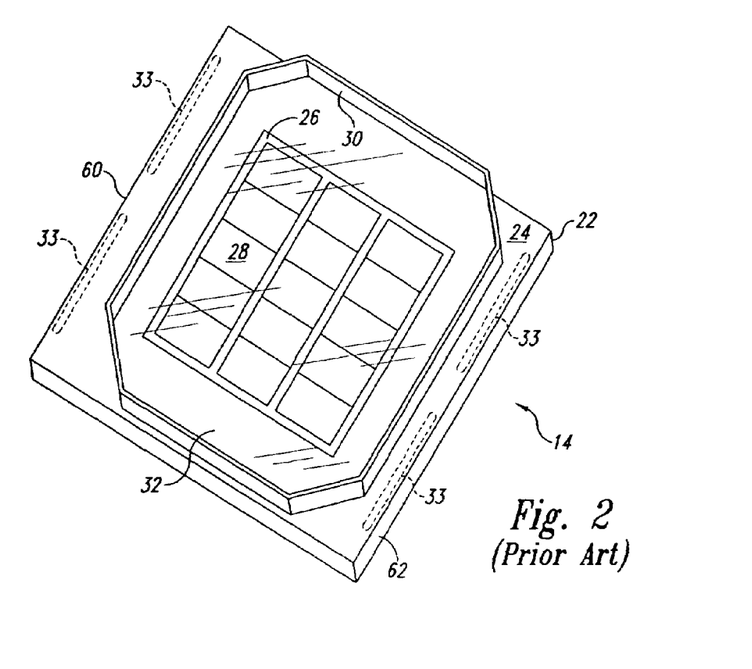
FIG. 2 is a perspective view of a conventional reticle with a pellicle frame and a pellicle membrane.

FIG. 2 shows a conventional reticle 14 including a transparent plate or "blank" 22 covered with a patterned opaque film 24. The recticle 14 has a mask area 26 in which the film 24 includes several masks 28 or patterns on respective portions of the photoresist layer 18. Each mask 28 within the mask area 26 may be different, so as to make different integrated circuits. Hereafter, the terms "pattern", "mask", and "photomask" are used synonymously in both the singular and plural sense and should not be construed to limit any aspect of the description. The patterned opaque film defines the pattern that will be formed in the resist layer for depositing, etching, doping or implanting processes on the wafer. The patterned film on the reticle blank includes mask lines and line spaces that are typically less than 10 microns. Depending on a reduction factor, the line width and line space geometry for a resulting semiconductor device are much smaller than the mask lines and line spaces on the patterned film. Other mask line spacing and semiconductor line spacing can also be achieved. When working with a high density of small features, it is important that the reticle and other components in the fabrication processes be free of foreign particles. A tiny speck of dust, for example, can alter the desired pattern being imaged onto the wafer.

Figure 3:
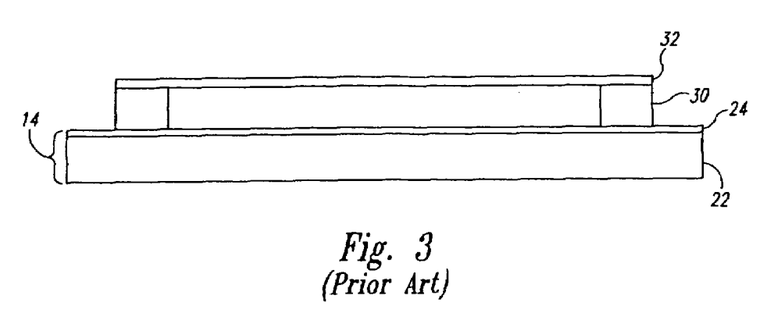
FIG. 3 is a side view of the reticle, pellicle frame, and pellicle membrane of FIG. 1.

One conventional technique for protecting the photomask on a reticle is to cover the photomask with a thin transparent membrane, referred to as a pellicle membrane. FIGS. 2 and 3 show a pellicle frame 30 that encloses the mask area 26 of the reticle having the masks 28. A thin membrane called a pellicle membrane 32 is adhered to the pellicle frame 30. The pellicle membrane 32 protects the mask area 26 from the external environment and is sealed to the pellicle frame 30 using a pellicle glue ring. The pellicle membrane 32 is positioned at a height above the photomask greater than the focal length of the light imaged onto the photomask. Thus, small particles on the pellicle membrane will not block light from reaching the photomask.

When a reticle with masks 28 is formed, the surface is cleaned and qualified to insure that the mask is accurate and that no foreign particles are present. As part of such qualification process, the pellicle membrane 32, which is formed of conventional materials such as cellulose acetate or nitrous cellulose, is adhered to the pellicle frame 30 protecting the masks 28 from foreign particles.

One problem caused by foreign particles even when the reticle is protected by the pellicle membrane 32 is that the reticle may not be registered properly relative to the table or another reticle. As shown in FIG. 1, the reticle 14 rests on a reticle table 16 during the lithographic process. The lithographic processes often require that a given reticle 14 be replaced on the reticle table 16 with another reticle having a different mask pattern. This movement of reticles on and off the reticle table 16 can cause small particles to adhere to the reticles 14. Further, reticles typically are stored in a carrying case. Microscopic particles also may adhere to the reticles from rubbing along rails of the reticle carrying case. If any foreign particles are on the reticle in the regions 33 where the reticle 14 contacts the reticle table 16, then the reticle may not be seated for proper alignment. A foreign particle under a portion of the reticle 14, for example, may cause that portion of the reticle 14 to be higher than another portion. This can cause inadequate registration of the light passing through a mask onto a wafer, or misalignment from one mask to another mask. If such problems are detected, the reticle must be removed and cleaned.

Another problem of photo-lithography is that cleaning the reticle can be difficult. For example, cleaning the reticle is time consuming, which can cause significant downtime for a stepper machine and affect the throughput of workpieces. Additionally, because the pellicle membrane 32 typically is very fragile, it may be destroyed during the course of cleaning the reticle. A typical procedure for cleaning a reticle involves removing the pellicle membrane 32 from the pellicle frame 30 to clean the surface of the reticle. The pellicle glue ring is also removed in this process. The solvent necessary to remove the glue ring is, however, caustic and can irreparably damage the photomask portion of the reticle. Thus, even when reticles are handled with great care, the photomask portion is easily damaged merely by the chemicals that are necessary for preparing the pellicle frame for a new pellicle membrane.

BRIEF DESCRIPTION OF THE DRAWINGS

The same reference numbers identify identical or substantially similar elements or acts in FIGS. 4-10. It will be appreciated that certain details of components have been abstracted in FIGS. 4-10, and the headings provided herein are for convenience only and do not necessarily affect the scope or meaning of the claimed invention.

DETAILED DESCRIPTION

The following disclosure describes several embodiments of cleaning systems to clean pellicle frames for refurbishing photomasks (i.e., phaseshift masks). In one embodiment, the cleaning and re-qualification of a phaseshift mask is accomplished using a phaseshift acid cover that protects the valuable photomasks from an acidic solvent used to clean the pellicle frame and glue ring. The acid cover, or lid, can be coupled to a base or chuck to isolate the photomasks from the cleaning solvent. The reticle is placed and secured between the acid cover and base to encase the photomask while leaving the pellicle frame and glue ring exposed. With the reticle secure and the lid in place, a chuck can rotate the reticle and lid under a high pressure spray that removes foreign contaminants from the exposed areas. After the pellicle glue ring, the pellicle frame and other exposed areas of the reticle have been cleaned using an acidic solution, the lid can be removed so that contaminants in the photomask area can be eliminated using less caustic solvents. The cover accordingly protects the photomask from being damaged by the caustic solutions that are necessary to clean the glues from the pellicle frame.

Figure 4:
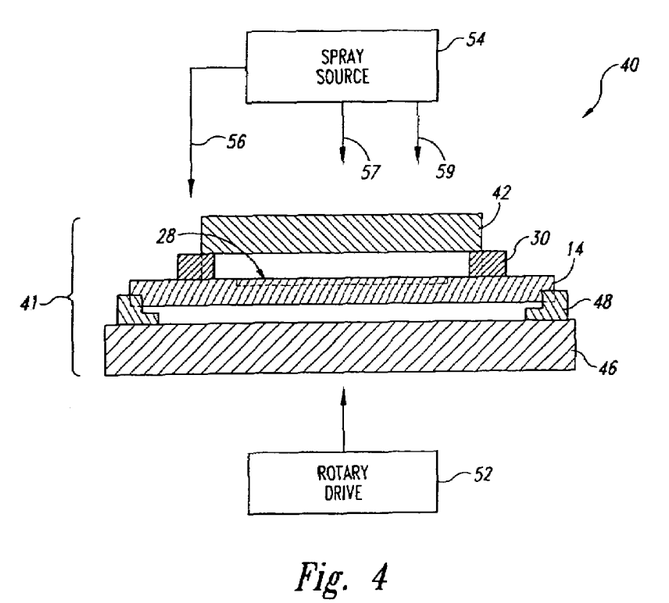
FIG. 4 is schematic view of a reticle cleaning system in accordance with one embodiment of the invention.

FIG. 4 is a schematic view illustrating a cleaning system 40 according to an embodiment of the claimed invention. In the embodiment shown in FIG. 4, the cleaning system 40 includes a mask protector 41 having a cover or lid 42 and a holder or chuck 46. The chuck 46 can be a base or other type of fixture configured to carry or hold the reticle 14. The chuck 46, for example, can further include a plurality of reticle supports 48 that each receive a corner of the reticle 14. The lid 42 can be a cover or another type of shield that is carried by the chuck 46. In one embodiment, the lid 42 is a rigid cover that encases the mask area 26, but does not obstruct the outer portion of the pellicle frame 30. The lid 42 has a interface surface that can also include a seal, such as an o-ring, that engages the surface of the reticle 14 around the perimeter of the mask area 26. The lid 42 can be coupled to the chuck 46 so that a seal (not shown in FIG. 4) presses against the surface of the reticle 14.

In an alternative embodiment, the lid 42 can include a rim that extends from one of the planar surfaces of the lid and defines a recess in the lid. The rim itself can be of such a design to create an interface between the lid and the reticle 14 surrounding the mask area 26. In other embodiments, an O-ring or other seal can be placed in a groove in the lid 42 to further define the interface surface between the lid 42 and the reticle 14.

The cleaning system 40 can also include a rotary drive 52 to which the chuck 46 can be mounted. In operation, the reticle 14 is clamped between the lid 42 and the chuck 46, and the drive 52 rotates chuck 46 while the sprayer 54 ejects a fluid to clean and/or rinse the pellicle frame 30. The sprayer 54 is also referred to herein as a fluid dispenser. In one embodiment, the sprayer 54 has a fan spray 57 that ejects a fluid onto the upper surface of the lid 42, reticle 14, and chuck 46, and a high pressure spray 56 that ejects a high pressure stream onto at least the exposed portions of the reticle 14. The fan spray 57 and the high pressure spray 56 can use de-ionized water an/or other liquids or gases. The high pressure spray 56, for example, can be ammonium hydroxide, de-ionized water, and/or another liquid or gas. In one particular method for cleaning the reticle 14, the spin chuck 46 rotates at 1500 revolutions per minute while both the fan spray 57 and the high pressure spray 56 eject fluids. The high pressure spray 56 then ceases, followed by cessation of the fan spray 57. A rinse spray 59 can then be used to remove residual acids from-the reticle 14. After stopping the rinse spray 59, the chuck 46 then increases the rotational rate (e.g., to 2000 rpm) during a drying period. The rotational speeds of the chuck 46, the pressure of the fluids emitted from sprays 56 and 57, and the time for spraying and drying the assembly may be different in other embodiments.

In another embodiment, the cleaning system 40 can have a bath instead of or in addition to the sprayer 54. The reticle can be cleaned by submerging it into the bath. As such, the term "dispensing a fluid" as used herein includes spraying a fluid onto the reticle and/or submerging the reticle in the fluid.

The cleaning system 40 can clean glue from the pellicle frame 30 using aggressive cleaning solutions without damaging the delicate photomasks 28. The glue is removed from the pellicle frame 30 because the pellicle frame 30 and a perimeter portion of the reticle 14 are exposed to the high pressure fluid spray 56. In a preferred embodiment, the entire portion of the pellicle frame 30 containing the pellicle glue ring is exposed during the cleaning process. The masks 28 however, are protected by the lid 42 because it provides a shield that protects the masks 28 from the cleaning solution used to remove the glue. The high pressure spray 56 can thus use aggressive solvents (e.g., $H_2SO_4/H_2O_2/NH_4OH$,) to remove contaminants, residual portions of the pellicle, and the pellicle glue. After the pellicle glue has been removed, the lid 42 can be removed and the masks 28 can be cleaned using a less aggressive solvent and cleaning process.

Figure 5:
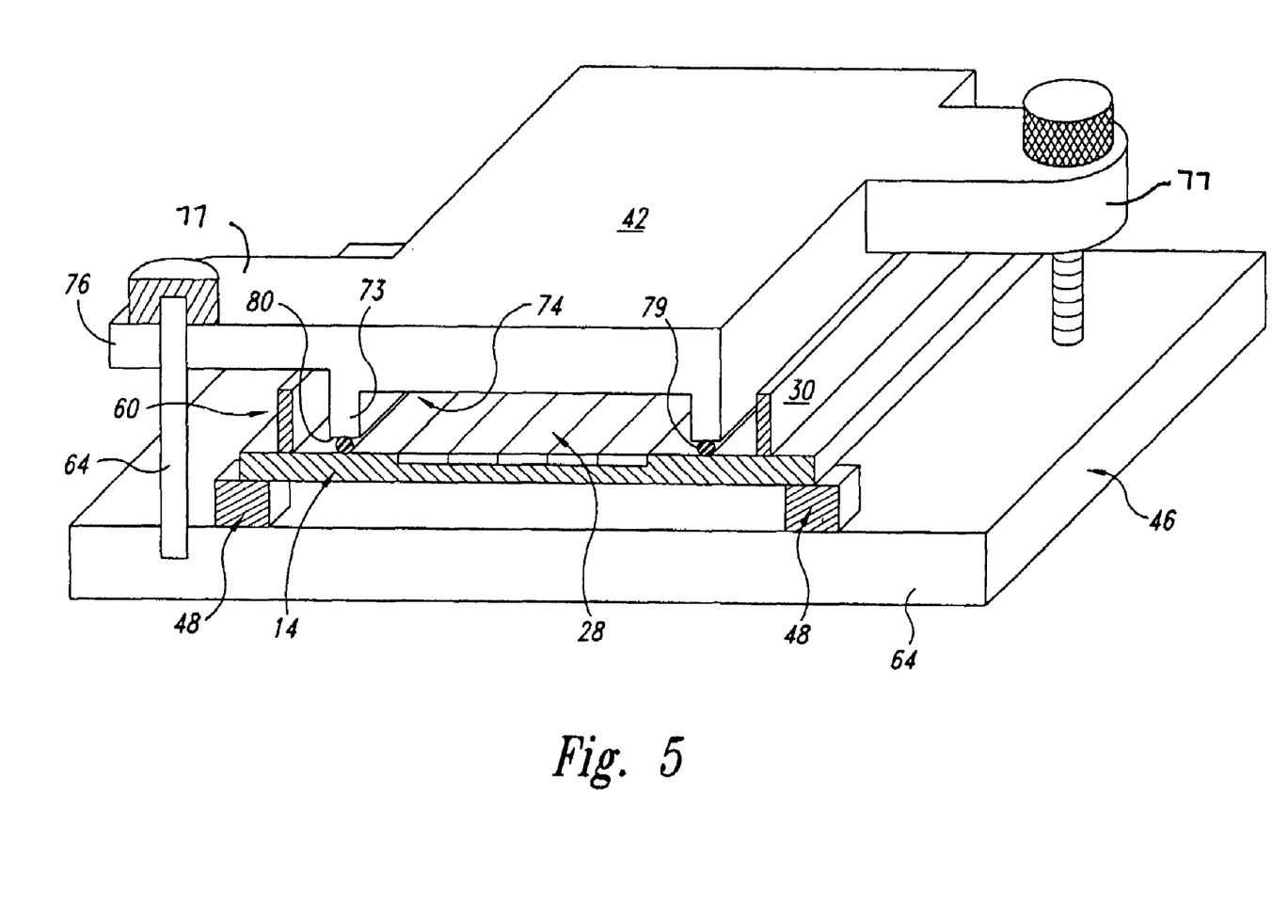
FIG. 5 is a perspective cut away view of a reticle cleaning system in accordance with one embodiment of the invention.

FIG. 5 is a perspective cut away view showing several features of an embodiment of the chuck 46 and the lid 42 in greater detail. The lid 42 can have a top panel 76 and a rim 73 defined by a wall 84 that depends from the top panel 76. The rim 73 can be configured so that the wall 84 fits within the pellicle frame 30, and the top panel 76 can be configured so that the rim of the pellicle frame 30 is exposed to a spray from the washer. The rim 73 and the top panel 76 define a recess 74 in which the masks 28 are positioned. The top panel 76 can also have a plurality of flanges 77, and a pin 64 can pass through each flange 77 and threadedly engage the chuck 46.

The lid 42 can also have an interface surface that seals against at least one of the reticle 14 and/or the pellicle frame 30. In the embodiment shown in FIG. 5, the rim 73 has a distal surface 80 and a seal 79 at the distal surface 80. The seal 79 can be an o-ring, a silicon bead, an inflatable tube or another type of seal that can contact the surface of the reticle 14. The seal 79 in this embodiment defines an interface surface that seals against the surface of the reticle 14. In operation, the pins 64 drive the seal 79 against the reticle to encase the masks 28 in the recess 74 and clamp the reticle 14 between the lid 42 and the chuck 46.

Figure 6A:
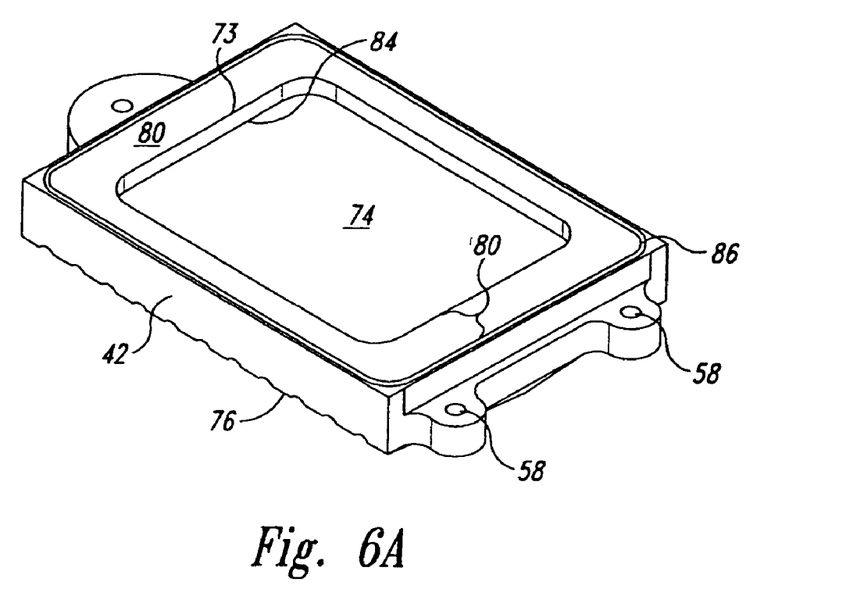
FIG. 6A is a bottom isometric view of a mask cover for use in an embodiment of the reticle cleaning system of FIG. 4.
Figure 6B:
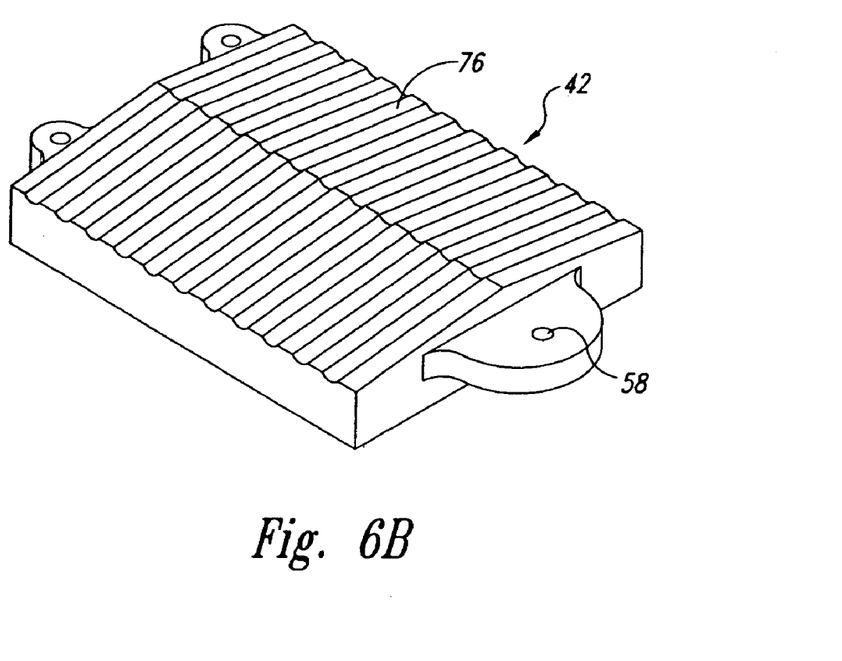
FIG. 6B is a top plan view of the mask cover of FIG. 6A.
Figure 7:
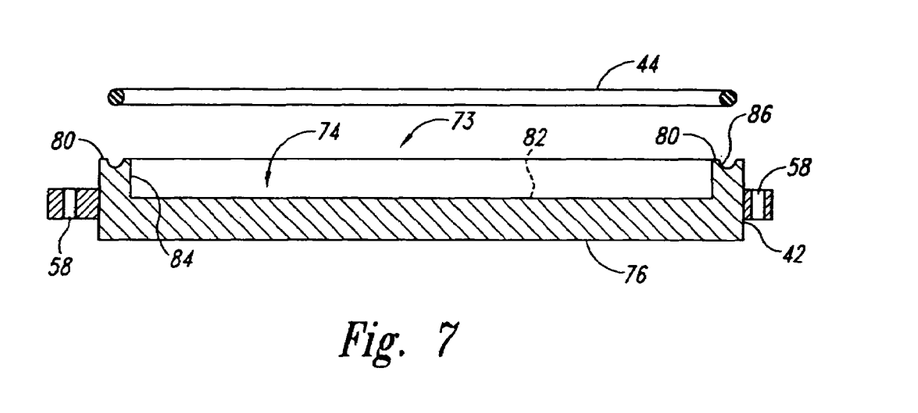
FIG. 7 is a side view of a mask cover of FIG. 4, along with a side view of an O-ring, according to one embodiment.

FIGS. 6A and 6B illustrate additional features of one embodiment of the lid 42. The top panel 76 can be a rigid member having a shape selected according to the shape of the mask area 26 and the pellicle frame 30 (FIG. 2). More specifically, the lid 42 is configured so that most of the pellicle frame 30 and pellicle glue ring remain exposed. The recess 74 is defined by the interior surfaces of the wall 84 and the top panel 76. The seal 79 along the distal surface 80 can be an O-ring 44 in a groove 86 along the distal surface 80 (best shown in FIG. 7). The O-ring 44 seats within the groove 86 and can extend along the entire circumference of the distal wall 80 to form a seal around the masks 28. In other embodiments, an alternative sealing device is used, such as a gasket. In one embodiment, the groove is 0.07 inches wide with a depth of 0.04 inches. The distal surface 80 of the rim 74 can have a width of 0.5 inches. Such dimensions, however, vary for differing embodiments. Preferably, the seal 79 and the lid 42 are formed of material that does not readily chip and is not affected by the acidic cleaning solution.

Figure 8:
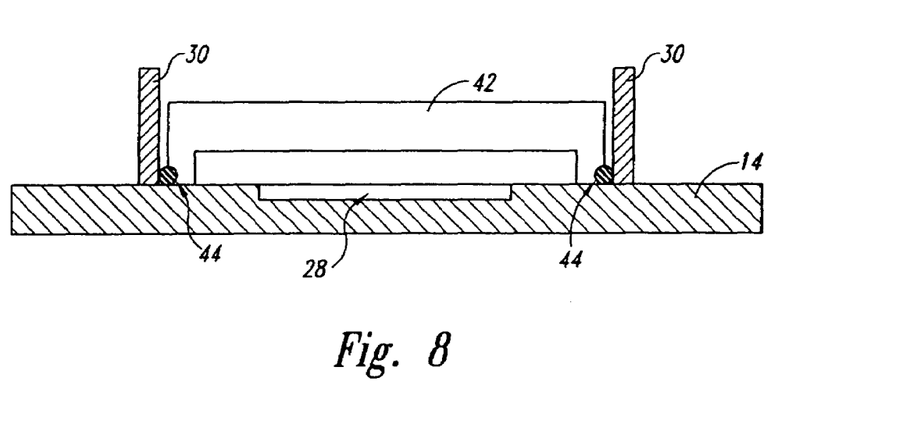
FIG. 8 is a side view of one embodiment of a mask cover in accordance with the claimed invention using an O-ring positioned between the pellicle frame and the lid to isolate the photomasks.

FIG. 8 illustrates an alternate embodiment in which the lid 42 isolates the photomasks 28 from the pellicle frame 30 by forming a seal with the interior wall of the pellicle frame 30. The lid 42 can include a groove 86 and O-ring 44 combination along the exterior vertical edge of the lid 42 to facilitate the seal as the O-ring 44 contacts the interior wall of the pellicle frame 30. The size of the lid should be slightly less than the interior dimensions of the pellicle frame 30 to create an adequate seal between the pellicle frame and the O-ring 44 for isolating the photomasks. In one embodiment, the seal can be an inflatable element that is inflated to press against the reticle frame 30.

Figure 9:
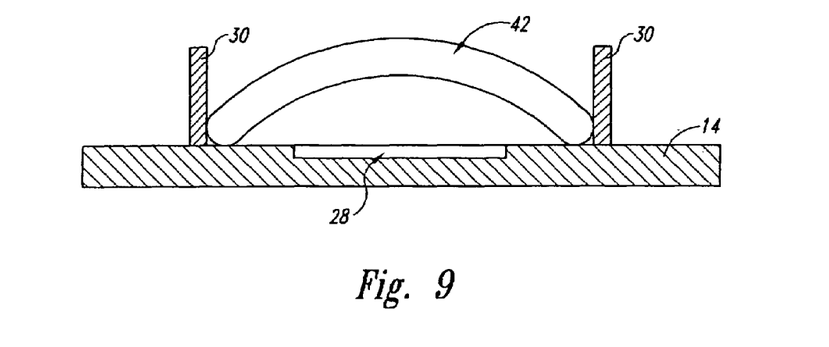
FIG. 9 is a side view of one embodiment of a mask cover in accordance with the claimed invention using an inflatable bladder to secure the cover to the reticle.

FIG. 9 illustrates another embodiment in which the lid 42 is an inflatable bladder. The lid itself can be inflated to seal against the reticle frame 30. In this embodiment, the bladder expands laterally to engage the side walls of the pellicle frame forming a seal that isolates the masks. The bladder can be fabricated to have a concave shape with a recessed area over the masks as it inflates.

Figure 10:
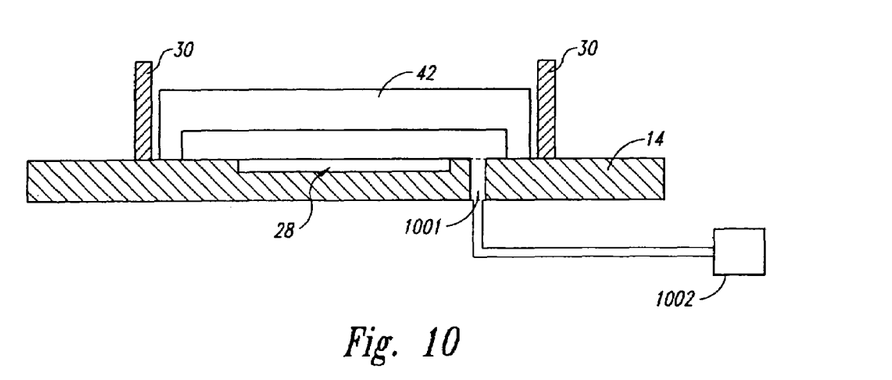
FIG. 10 is a side view of one embodiment of a mask cover in accordance with the claimed invention using a localized lower air pressure to secure the mask cover to the reticle.

FIG. 10 shows another alternate embodiment for isolating a photomask during a cleaning process. In this embodiment, the lid 42 can be secured to the reticle 14 by evacuating the air in the area between the lid 42 and the reticle 14. The reticle 14 can have an opening 1001 that is coupled to a vacuum pump 1002. With the lid 42 in place, the pump 1002 can lower the relative pressure inside the recessed, isolated region of the photomasks. The lower pressure will keep the lid secure while the cleaning process is ongoing, thus protecting the mask area. Alternatively, the lower pressure can be accomplished by evacuating the air or atmosphere through a small hole in the lid.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," and words of similar import, when used in this application, shall refer to this application as a whole and not to any particular portions of this application.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other cleaning processes.

Aspects of the invention can be modified, if necessary, to employ the systems, functions and concepts of the various patents and applications described above to provide yet further embodiments of the invention. These and other changes can be made to the invention in light of the above detailed description. In general, in the following claims, the terms used should not be construed to limit the invention to the specific embodiments disclosed in the specification and the claims, but should be construed to include all cleaning systems that operate under the claims to provide a method for removing contaminants from a reticle. Accordingly, the invention is not limited by the disclosure, but instead the scope of the invention is to be determined entirely by the claims.

We claim:

1. In the fabrication of microelectronic devices, a method for cleaning a reticle having a plate, a photomask in the plate, and a pellicle frame around the photomask, the method comprising:

sealing a cover around the photomask so that a portion of the pellicle frame remains exposed; and dispensing a cleaning fluid onto the exposed portion of the pellicle frame.

2. The method of claim 1, wherein sealing includes surrounding the photomask with the cover, the cover having a rigid rim and a seal extending from the rim.

3. The method of claim 1, wherein sealing includes encasing the photomask with the cover, the cover having a rigid casing and a seal, the casing having a rim and an interior cavity within the rim, and wherein the seal is carried by the casing to seal against the plate.

4. The method of claim 1, wherein sealing includes defining an interface surface between the plate and a seal, the seal being in a groove of an end surface around a rigid rim of the cover, the cover defining a recess.

5. The method of claim 1, wherein sealing includes defining an interface surface between the pellicle frame and a seal, the seal being in a groove in an edge surface of a rigid rim of the cover.

6. The method of claim 1, wherein sealing includes pressing a cover against the pellicle frame with an inflatable bladder, and wherein the cover has a recess aligned with the photomask.

7. The method of claim 1, wherein sealing includes clamping the cover to the plate.

8. The method of claim 1, wherein sealing includes drawing the cover to contact the plate using a vacuum assembly coupled to a hole in the plate.

9. The method of claim 1, wherein:
   sealing includes defining an interface surface between the plate and a seal, the seal being in a groove of an end surface around a rigid rim of the cover, the cover defining a recess; and
   further comprising clamping the cover to the plate.

10. The method of claim 1, wherein:
    sealing includes defining an interface surface between the plate and a seal, the seal being in a groove of an end surface around a rigid rim of the cover, the cover defining a recess; and
    further comprising drawing the cover to contact the plate using a vacuum assembly coupled to a hole in the plate.

11. The method of claim 1, wherein sealing includes forming a fluid baffler between the photomask in the plate and the pellicle frame.

12. A method for cleaning a reticle, comprising:
    isolating a mask area of the reticle from a pellicle frame on the reticle; and
    directing at least one fluid source to spray a fluid onto the pellicle frame.

13. The method of claim 12, wherein the fluid is capable of removing an adhesive from the pellicle frame.

14. The method of claim 12 wherein:
    the reticle is carried on a base; and
    the method further comprises rotating the base.

\* \* \* \* \*

UNITED STATES PATENT AND TRADEMARK OFFICE
CERTIFICATE OF CORRECTION

PATENT NO. : 7,300,526 B2  Page 1 of 1
APPLICATION NO. : 11/368895
DATED : November 27, 2007
INVENTOR(S) : Hedges et al.

It is certified that error appears in the above-identified patent and that said Letters Patent is hereby corrected as shown below:

In column 8, line 12, in Claim 11, delete "baffler" and insert -- barrier --, therefor.

Signed and Sealed this

Twenty Second Day of April, 2008

JON W. DUDAS
*Director of the United States Patent and Trademark Office*